United States Patent [19]

Misawa et al.

[11] 4,166,316
[45] Sep. 4, 1979

[54] PIN INSERTION METHOD AND APPARATUS

[75] Inventors: Yoshihiko Misawa; Kazuhiro Mori; Shigeru Araki, all of Katano, Japan

[73] Assignee: Matsushita Electric Industrial Co., Ltd., Osaka, Japan

[21] Appl. No.: 866,368

[22] Filed: Jan. 3, 1978

[30] Foreign Application Priority Data

Jan. 12, 1977 [JP] Japan ................................ 52-2760

[51] Int. Cl.² .......................................... H05K 13/04
[52] U.S. Cl. ...................................... 29/626; 29/739; 72/334
[58] Field of Search ...................... 29/626, 739, 625; 72/324, 334

[56] References Cited

U.S. PATENT DOCUMENTS

| 3,216,097 | 11/1965 | Stricker | 29/739 |
| 3,494,029 | 2/1970 | Theilgaard | 29/626 |
| 3,605,465 | 9/1971 | Timmerbeil | 72/324 |
| 3,624,676 | 11/1971 | Whitney | 29/739 |
| 3,710,480 | 1/1973 | Royse | 29/739 |
| 3,789,481 | 2/1974 | Coller | 29/739 |
| 3,938,245 | 2/1976 | Lovendusky | 29/739 |

Primary Examiner—Lowell A. Larson
Assistant Examiner—Gene P. Crosby
Attorney, Agent, or Firm—Burgess, Ryan and Wayne

[57] ABSTRACT

Method and apparatus for inserting pins having a predetermined length into predetermined apertures in a board or the like such as a printed circuit board. A pin blank square in cross section and in the form of a wire hoop is notched in four faces for cutting, fed at a predetermined feeding speed and cut off at the notched portions, whereby a pin having a predetermined length is prepared. The pin is directed perpendicular to the board or the like and inserted into a predetermined aperture in the board or the like.

25 Claims, 29 Drawing Figures

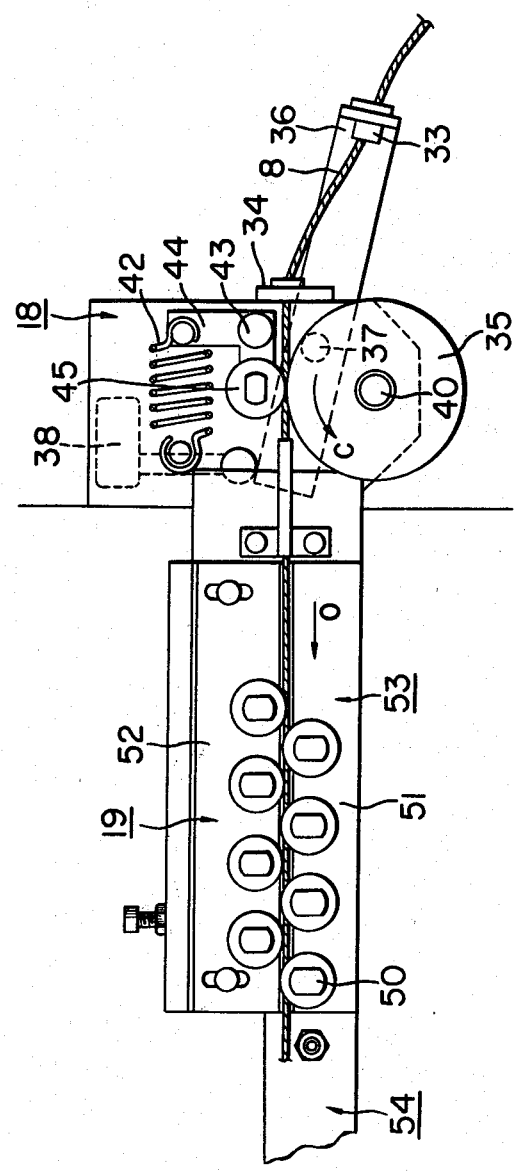

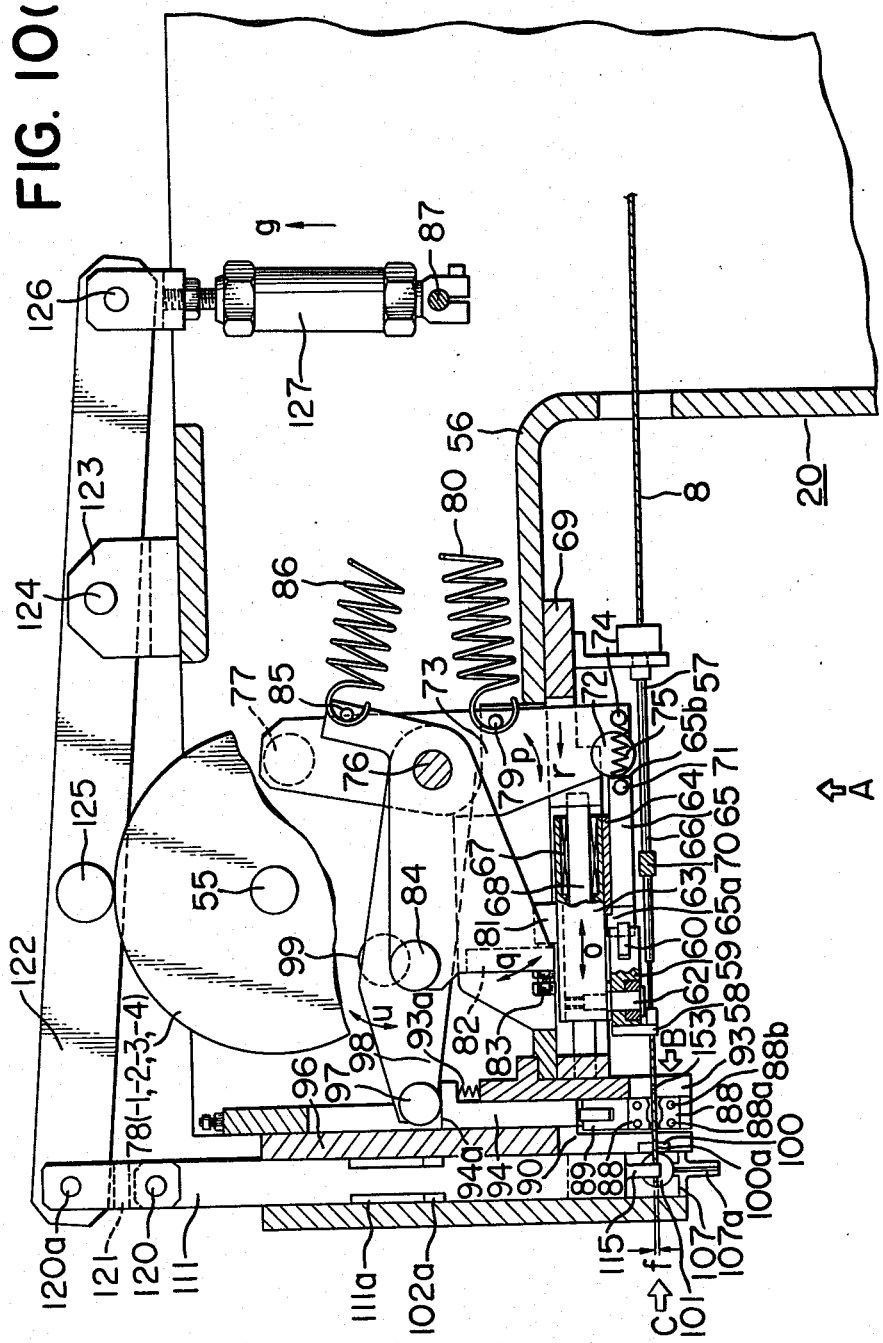

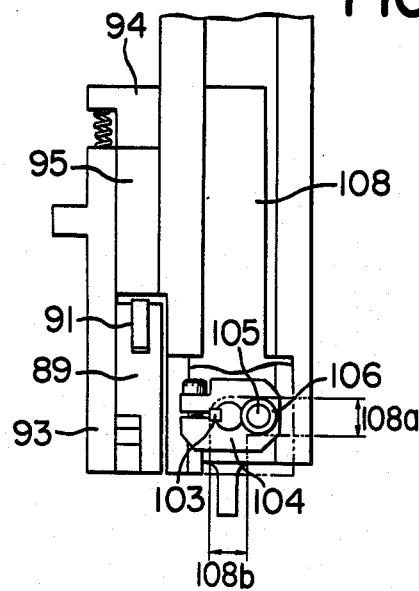
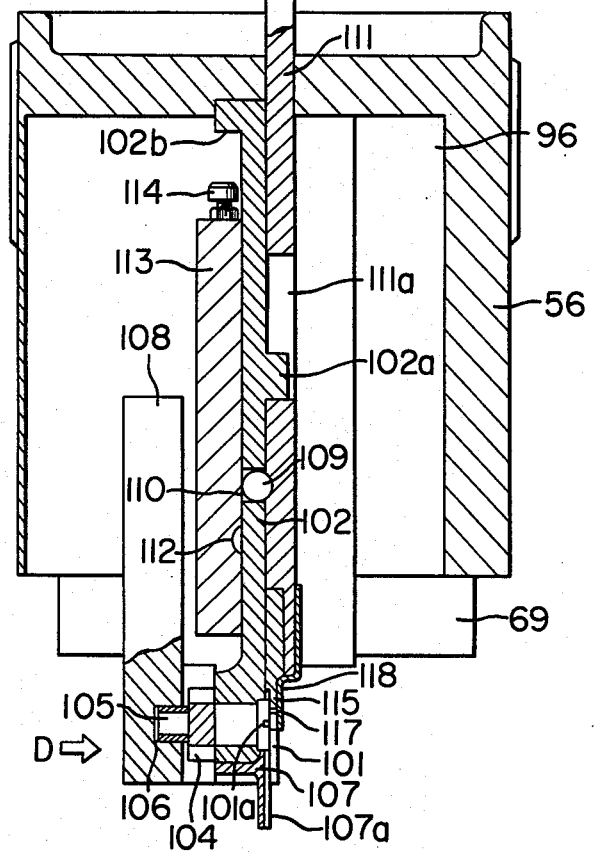
FIG. 10(d)
FIG. 10(e)

PIN INSERTION METHOD AND APPARATUS

BACKGROUND OF THE INVENTION

The present invention relates to a pin insertion method and apparatus wherein a hoop-shaped or a straight pin blank in the form of a wire is sequentially cut off into a pin having a predetermined length and pins are inserted into predetermined apertures of a board or the like such as a printed circuit board, the board or the like with inserted pins being a completed part. The present invention particularly relates to a pin insertion method and apparatus which may be used for automatically inserting a single or a plurality of pins made of an electrically conductive material as a terminal or terminals into a predetermined aperture or apertures in a printed circuit board upon which are mounted various electrical and electronic parts and which is highly efficient in operation, inexpensive and capable of correctly inserting the pins in predetermined apertures of a board or the like.

In general, apparatus for inserting square pins (square in cross section) and round pins (circular in cross section) into predetermined apertures in boards or the like are divided into two types. With one type a part preformed in the shape of a square pin is fed to an insertion position through a feed pipe by a part feeder. A plurality of such feed pipes are connected to a die which determines a pin insertion pattern. A board or the like is placed between this die and a female die, and the male and female dies are pressed against each other, whereby a plurality of pins may be simultaneously inserted into predetermined apertures in the board or the like.

With the other type a pin blank in the form of a hoop is cut off into pins which in turn are inserted into predetermined apertures in a board or the like.

The former type has the problems that a large number of parts which are preformed into for instance square pins must be prepared so that the cost is high and that the male and females dies must be changed as the pin insertion pattern is changed so that the initial cost is high and it takes a long time for the replacement of the male and female dies.

The latter type also has some problems. First, the pin blank is fed by a feed pawl, but in order to prevent damage to the pin blank, the pressure exerted on the pin blank from the feed pawl must not so excessive that slip of the pin blank results. As a consequence the pin blank cannot be cut into a pin having a predetermined length, and the cutoff pins vary in length from one pin to another. Furthermore cutting requires a high power. Since the pin insertion member is rotated, the pin tends to fall off. As a result a high pin insertion speed cannot be attained. Furthermore, because of shearing burrs are formed at the sheared edge so that the cut area of the pin becomes greater than the original cross sectional area of the pin blank and consequently cannot be inserted into an aperture and damages the board or the like.

Both types have a common problem that the faces of inserted square pins are oriented in random directions.

SUMMARY OF THE INVENTION

One of the objects of the present invention is to provide a pin insertion method and apparatus wherein pins are sequentially cut off from a pin blank in the form of a wire and inserted into apertures of a board or the like. The pins may be cut off at a high speed, but the variations in length of pins may be minimized, and the pins may be inserted at a high speed.

Another object of the present invention is to provide a pin insertion method and apparatus wherein a pair of feed pawls which grip the pin blank for intermittent feed are adapted to notch the faces of the pin blank so that a pin may be easily cut off from the pin blank from the notched portion with less cutting force and that cutting impact and noise may be minimized.

A further object of the present invention is to provide a pin insertion method and apparatus wherein a rotary cutting means is provided which receives the leading portion of the pin blank corresponding in length to a pin to be cut off therfrom, rotates in one direction to cut off a pin from the pin blank and rotates in the other direction to orient the pin in line with the pin insertion direction, whereby the pin insertion operation may be carried out at a high speed so far unattainable by any prior art methods and apparatus.

A further object of the present invention is to provide a pin insertion method and apparatus wherein straightening means is provided for straining a pin blank in the form of a hoop, whereby straight pins having a correct length may be prepared.

A still further object of the present invention is to provide a pin insertion method and apparatus wherein the four faces of the pin blank are notched at cutting positions prior to cutting so that the cut end is beveled and consequently the insertion of the pin may be much facilitated.

An yet further object of the present invention is to provide a pin insertion method and apparatus wherein a pin may be notched intermediate the ends so that the flow of solder along the pin to the top thereof may be avoided in case of soldering the pin to the board or the like.

A further object of the present invention is to provide a pin insertion method and apparatus wherein anvil means includes sensor means so that whether or not a pin has been correctly inserted into a predetermined aperture may be detected and consequently the misinsertion may be avoided.

A further object of the present invention is to provide a pin insertion method and apparatus wherein a flexible ribbon- or belt-shaped member is made into partial contact with the flanges of a reel holding a pin blank so that the pin blank may be prevented from riding off the flanges.

A further object of the present invention is to provide a pin insertion method and apparatus wherein means is provided upstream of the straightening means for imparting the pin blank the force in the direction opposite to the direction of the pin blank feed, whereby the feed of the pin blank may be correctly effected and the pin blank may be forcibly straightened.

To the above and other ends, briefly stated the present invention provides a pin insertion apparatus comprising a pin blank stock station for storing a pin blank in the form of a wire, feed means for intermittently feeding the pin blank at a predetermined pitch from the pin blank stock station, notching means for forming notch-like recesses in the faces of the pin blank, cutting means which receives therein the leading portion of the pin blank equal in length to a pin to be cut off therefrom, is rotated to cut off a pin from the pin blank and orients the cut-off pin in line with the pin insertion direction, pin insertion means for pushing the pin out of the cutting means and inserting into a predetermined aperture in a board or the like, and board for positioning means for supporting the board or the like and moving in the X- and Y-directions so that a predetermined aperture of the board or the like may be brought to the pin insertion position immediately below the pin insertion means.

BRIEF DESCRIPTION OF THE DRAWINGS

FIG. 7 is a side view of a straightening device and a tension imparting device;

FIG. 10(a) is a cross sectional view of a pin insertion head;

FIG. 10(d) is a view looking in the direction indicated by D in FIG. 10(e);

FIG. 10(e) is a front sectional view of the pin insertion head;

DESCRIPTION OF THE PREVERRED EMBODIMENT

Figure 1:
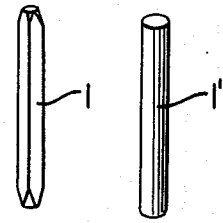
FIG. 1 shows pins used in the present invention.
Figure 2:
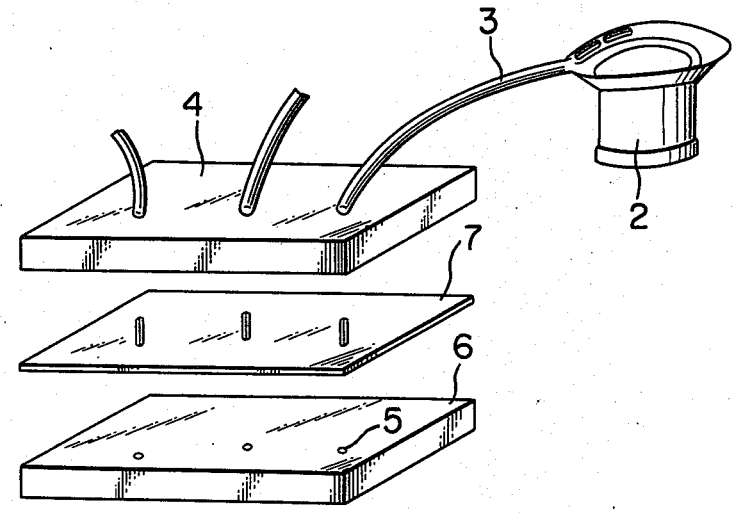
FIG. 2 is a schematic perspective view of a prior art pin insertion apparatus.
Figure 3:
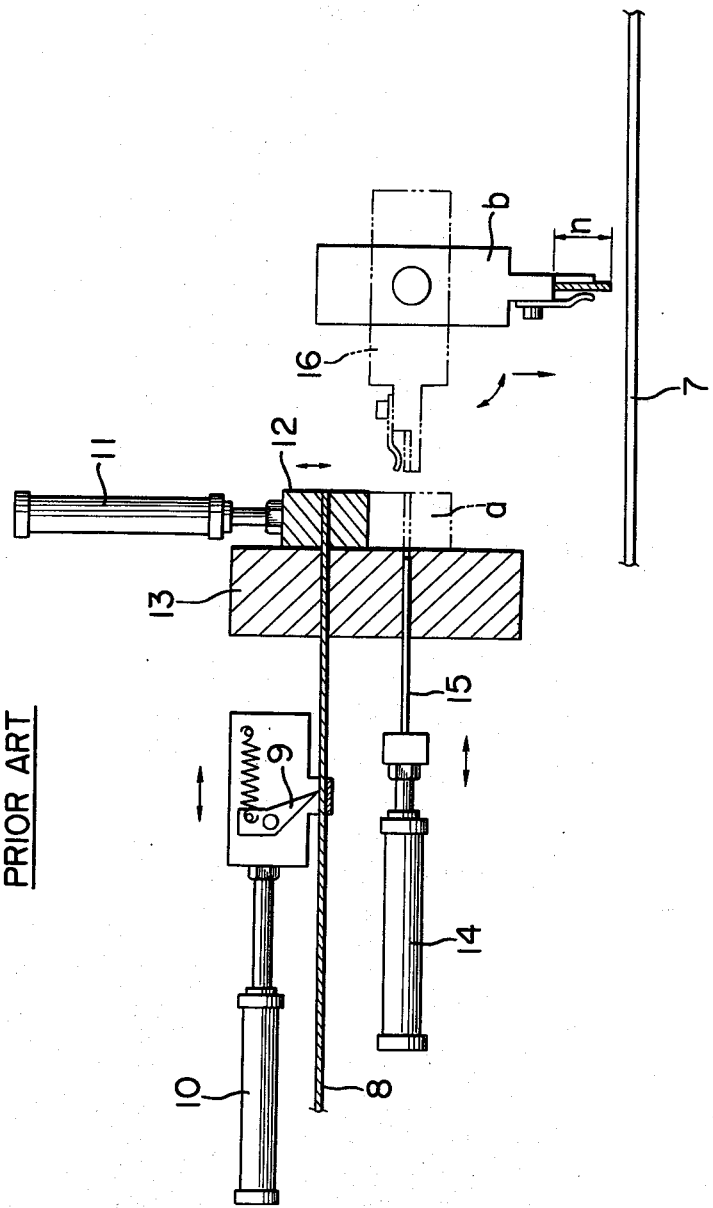
FIG. 3 is a schematic side view of another prior art pin insertion apparatus.

Prior Art, FIGS. 1-3

Prior to the description of the preferred embodiment of the present invention, prior art apparatus and methods for inserting pins such as a square pin (square in cross section) 1 and a round pin (circular in cross section) 1' as shown in FIG. 1 into apertures of a board will be briefly described. In general the prior art apparatus may be divided into two types. In one type shown in FIG. 2, parts which are prepared in the form of the square pin 1 are fed from parts feeders 2 through pipes 3 and are attached to a male die 4 according to a predetermined positional pattern. A board 7 is inserted between the male die 4 and a female die 6 having holes correspond to those of the male die 4, and the male and female dies 4 and 6 are pressed against each other, whereby a plurality of pins are simultaneously inserted into the apertures of the board 7.

The other type is schematically shown in FIG. 3 wherein a pin blank 8 in the form of a hoop is cut off and inserted into an aperture of the board 7. The pin blank 8 is advanced by a predetermined distance by a feed pawl 9 which is operated by a cylinder 10, and is cut off into a predetermined length by a cutting device consisting of a stationary die or cutter 13 and a movable die or cutter 12 operated by a cylinder 11. A pin thus cut off from the blank 8 is moved downward to a position a and received by a feed rod 15 operated by a cylinder 14. The feed rod 15 feeds the pin to an insertion head 16, which in turn rotates through 90° and inserts the pin into a predetermined aperture of the board 7.

The apparatus and method of the type shown in FIG. 1 are disadvantageous in that the parts must be previously formed in the shape of the square 1 so that the cost is expensive and that new male and female dies must be prepared whenever a pin insertion pattern is modified so that the initial cost is expensive and the replacement of the new male and female dies takes a long time.

The apparatus and method of the type shown in FIG. 3 are also disadvantageous. First the force of engagement of the feed pawl 9 with the pin blank 8 must be such that the feed pawl 9 may not cause any damages to the pin blank 8. As a result the feed pawl 9 slips so that the pin blank cannot be advanced by a predetermined length and consequently the lengths of the pins vary from a predetermined length n. Furthermore a high power is required for cutting off the pin blank 8. Moreover the insertion head 16 must be rotated with the pin inserted therein so that when the insertion head 16 is rotated at a fast speed, the pin flies away from the head. As a consequence the rotational speed of the insertion head 16 is limited. Furthermore the cross sectional area of the pin becomes greater than that of the pin blank 8 because of shearing. That is, burrs are formed at the sheared edges. As a result, the pin cannot be inserted into an aperture of the board 7 and causes the damage of the surface of the board 7.

Furthermore both types have a common defect that they cannot orient the side faces of the square pins in the same directions so that the side faces are oriented in the random directions.

The Invention, FIG. 4-22

Figure 4:
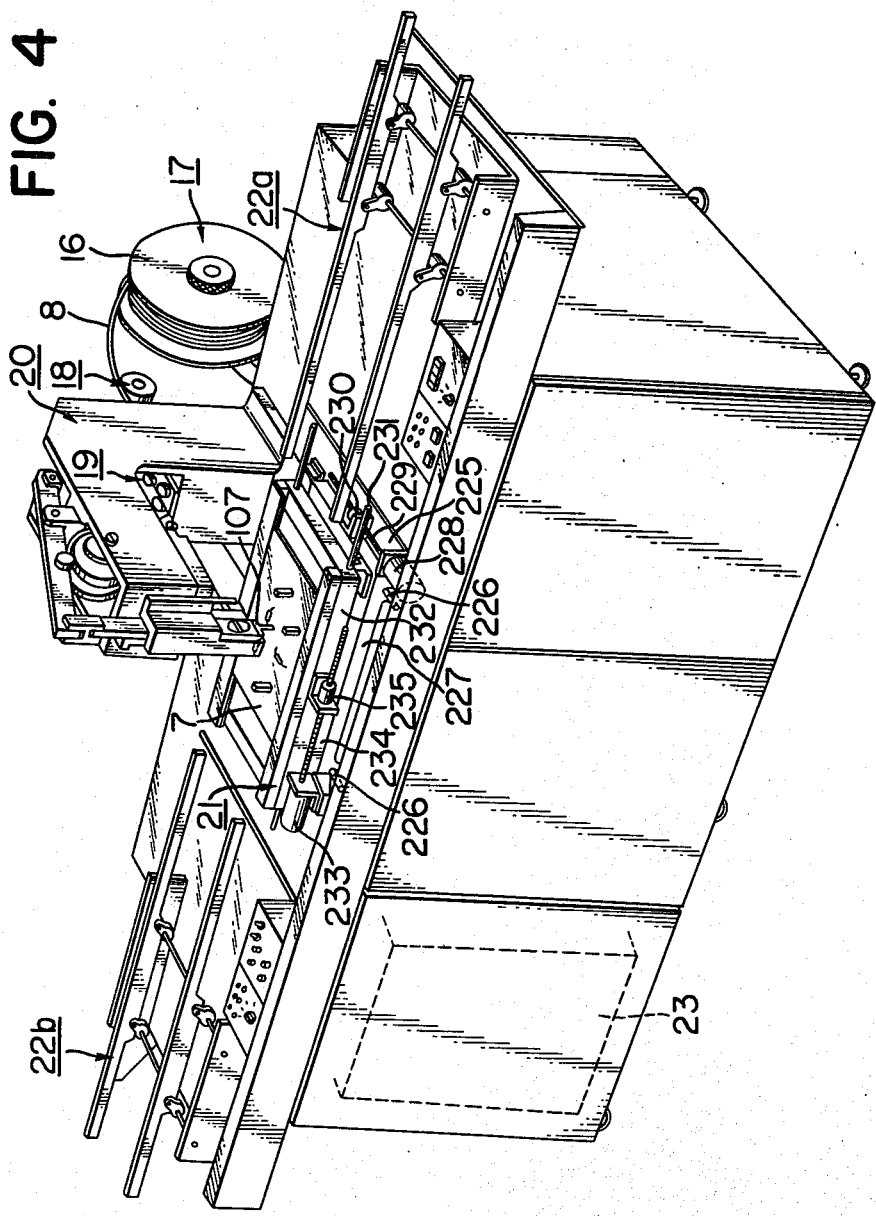
FIG. 4 is a perspective view of a pin insertion apparatus in accordance with the present invention.

In FIG. 4 there is shown a pin insertion apparatus in accordance with the present invention consisting of a stock station 17 having a reel 16 of a pin blank 8 in the form of a wire, a tension imparting device 18 for exerting the back tension to the pin blank 8, a straightening device 19 for straightening the curved pin blank 9, a pin insertion head or station 20 for feeding and cutting the pin blank 8 and inserting a pin into a predetermined aperture of the board 7, a board positioning device 21 for holding the board 7 such as a printed circuit board and moving it in X- and Y-directions (back and forth and right and left) so that a predetermined aperture may be positioned immediately below the pin insertion head or station 20, a loading device 22a for loading the board 7 into the board positioning device or station 21, an unloading device 22b for removing the board 7 from the board positioning device 21 and a control unit 23 for controlling all of the operations of the pin insertion apparatus.

Figure 5:
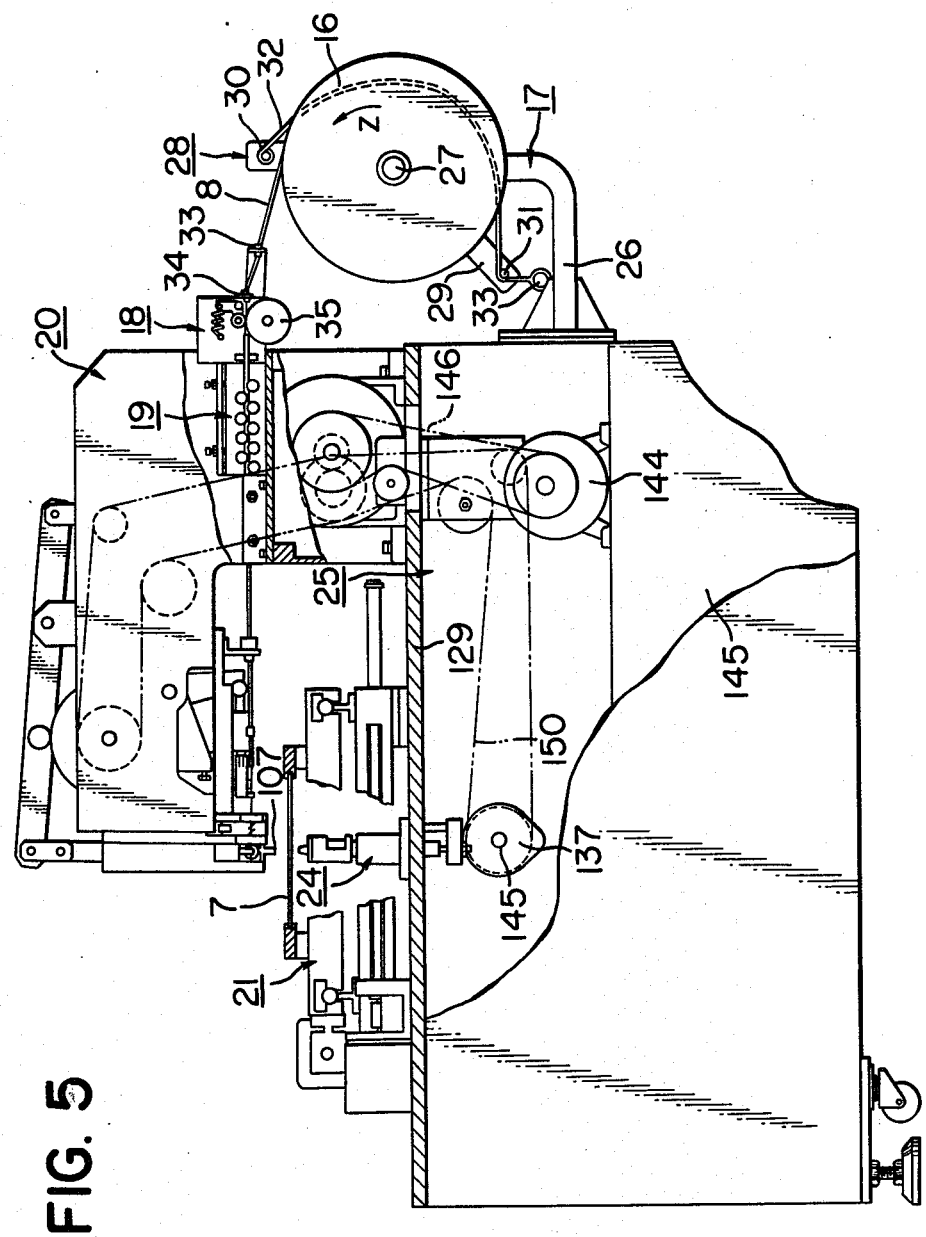
FIG. 5 is a side view, partly broken, thereof.
Figure 6:
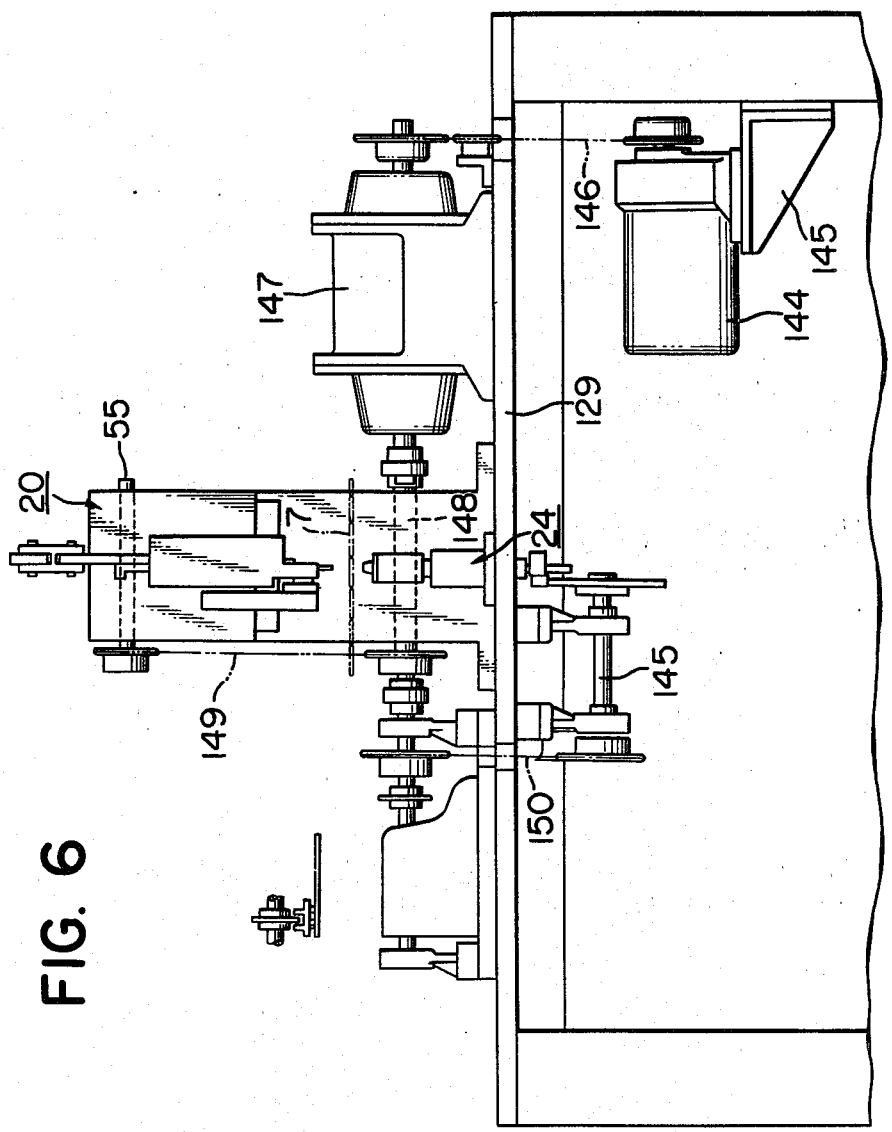
FIG. 6 is a front view thereof with a board positioning device and loading and unloading devices removed.

FIG. 5 is a side view of the pin insertion apparatus. The unloading device 22 is removed, and a lower die 24 and a drive system 25 are shown. FIG. 6 is a front view of the pin insertion apparatus with the board positioning device 21 and the unloading device 22 removed.

Stock Station 17

Figure 8:
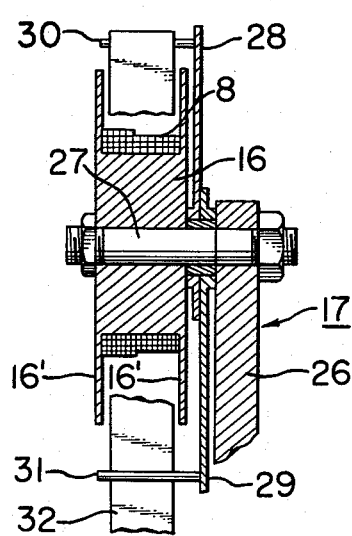
FIG. 8 is a sectional view of a stock station.

Referring to FIGS. 5 and 8, the stock station 17 has a reel stand 26 and a stationary shaft 28 carrying the reel 16 of the pin blank 8 in the form of a hoop. Levers 28 and 29 are extended, and bars 30 and 31 are extended from these levers 28 and 29 in parallel with the stationary shaft 27. A cloth ribbon 32 the upper end of which is securely fixed to the upper bar 30 is partly wrapped around the reel 16 and the lower bar 31, depends therefrom and is fixed at the other end of a weight 33 so that the cloth ribbon 32 may be normally exerted with the tension in the direction opposite to the direction of the pin blank feed. The cloth ribbon 32 serves not only for preventing the pin blank 8 from loosening and expanding but also for preventing the pin blank 18 from extending beyond the flanges of the reel 16. FIG. 8 is a rear view of the stock station 17.

Tensioning Device 18 and Straightening Device 19

Referring first to FIG. 7, the pin blank 8 which is fed from the stock station 17 passes through guide bushes 33 and 34 and is pressed against a grooved roller 35 by a pressure roller 45. The guide bush 33 is attached to a detection lever 36 which in turn is pivoted with a pin 37 to a stationary member. When the detection lever 36 is caused to rotate beyond a predetermined angle because of a malfunction of the stock station 17, it actuates a microswitch 38 so that the pin insertion apparatus may be automatically disabled, whereby the adverse effects on the pin insertion head may be avoided.

Figure 9:
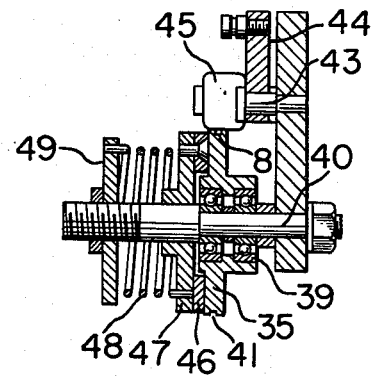
FIG. 9 is a sectional view of a grooved roller and its associated parts.

Referring to FIG. 9, the grooved roller 35 is supported by bearings 39 which in turn are mounted on a stationary shaft 40, and the pin blank 8 passes through a groove 41 of the grooved roller 35 and is pressed against the grooved roller 35 by the pressure roller 45 which is rotatably carried by one end of an L-shaped lever 44 pivoted with a pin 43 to the stationary member and biased with a coiled spring 42 so as to rotate about the pin 43. A friction disk 46 is attached to a disk 47 which in turn is rotatably and axially slidably carried by the stationary shaft 40 and normally biased toward the grooved roller 35 under the force of a biase spring 48 loaded between the disk 47 and an adjusting disk 49 securely mounted with a screw on the stationary shaft 40, whereby the friction disk 46 is made into frictional engagement with the grooved roller 35. The biasing force of the spring 48 may be suitably controlled by the adjusting disk 49.

When the pin blank 8 is transported in the direction o, the disk 47 is caused to rotate in the direction C, but the rotation of the disk 47 through a predetermined angle is limited by the spring 48 which acts as a torsional spring to cause the disk 47 to rotate in the direction opposite to the direction c. Therefore the back tension is always exerted to the pin blank 8 even when the pin insertion apparatus is not operating. The magnitude of the back tension may be controlled by the displacement of the adjusting plate 49 which in turn controls the compression of the spring 48.

Referring to FIG. 7 the straightening station 19 will be described. It consists of a vertical straightening device 53 and a horizontal straightening device 54 both of which are substantially similar in construction. Each of the vertical and horizontal straightening devices 53 and 54 consists of a stationary straightening plate 51 upon which are mounted a plurality of straightening rollers 50 in equidistantly spaced relationship, and a movable straightening plate 52 upon which are mounted a plurality of straightening rollers 50, which are spaced apart from each other by the distance equal to the distance between the straightening rollers 50 on the stationary plate 51. The upper and lower straightening rollers 50 are so arranged that the vertical line passing through the center of each roller intersects the midpoint of the line connecting between the centers of the adjacent rollers on the movable or stationary plate 52 or 51. The angular position of the movable plate 52 relative to the stationary plate 51 may be suitably adjusted.

Pin Insertion Head 20

Referring to FIGS. 10(a)–10(e), the pin insertion head 20 will be described. A cam shaft 55 carrying a plurality of cams 78-1, 78-2, 78-3 and 78-4 is rotatably attached to a head frame 56 and is rotated by the drive unit 25. The pin blank 8 is made to pass through a feed pipe 57 and reaches a pair of feed pawls 58 (See FIG. 10b) which are securely attached to one ends of levers 59 which are pivoted with pins 62 to a feed block 63 and the other ends of which carry rollers 60. Referring particularly FIG. 10(b), an adjusting screw 59a is provided in order to limit the gap between the pair of feed pawls 58 when they are moved toward each other.

A feed wedge 65 having a projection 65a is slidably mounted on the slide block 63 with a slide plate 64 and side plates 66 attached to the slide block 63. When the wedge 65 enters between the rollers 60, it causes the rollers 60 to move away from each other so that the feed pawls 58 move toward each other. When the wedge 65 is retracted, the projection 65a engages with the slide plate 64 so that the feed block 63 may be retracted.

The slide block 63 is pressure fitted with slide bushings 67 which in turn slide over slide shafts 68. Therefore the slide block 63 may be advanced or retracted in the directions indicated by the double-pointed arrow O.

A pipe supporting block 70 which bridges the side plates 66 slidably supports the feed pipe 57.

A tension spring 75 is loaded between a pin 71 extended from the end of the wedge 65 opposite to the wedge-shaped end thereof and a pin 74 extended from a feed lever 73 so that a feed roller 72 rotatably carried by the feed lever 73 at the lower end thereof may be normally pressed against the end face 65b of the wedge 65. The feed lever 73 is pivoted with a pivot pin 76 to the head frame 56 and carries a cam follower roller 77 at the other end thereof. The cam follower roller 77 is made into contact with one of the cams 78 so that upon rotation of the mating cam the feed lever 73 is caused to swing in the directions indicated by the double-pointed arrow p. A tension 80 is loaded between a pin 79 extended from the feed lever 73 and the head frame 56 so that the feed lever 73 is normally biased to rotate in the counter clockwise direction and consequently the cam follower roller 77 is normally pressed against its mating cam 78-1.

A stop lever 82 is also pivoted with the pivot pin 86 to the head frame 56 for selective engagement with a stopper block 81 attached to the upper surface of the feed block 63. As will be described in detail hereinafter, the feed lever 73 and the stop lever 82 cooperate with each other so that only the wedge 65 is advanced while the feed back 63 is maintained stationary or both the feed wedge 65 and the feed block 63 may be advanced or retracted in unison. The limit of the advance stroke of the feed block 63 may be adjusted by tightening or loosening an adjusting screw 83 which is threaded through the stop lever 82 and serves as a stop for engagement with the stop block 81.

A tension spring 86 is loaded between a pivot pin 87 extended from the head frame 56 and a pin extended from the upper end of the stop lever 82 so that a cam follower roller 84 carried by the stop lever 82 may be normally pressed against one of the cams 78. Therefore upon rotation of the mating cam 78 the stop lever 72 is caused to swing in the directions indicated by the double-pointed arrow q.

When the stop lever 82 is caused to rotate in the counterclockwise direction by the cam 78-2 so that the adjustable screw stopper 73 engages with the stopper block 81 on the feed block 63, a return stopper 151 which is position adjustably mounted on a block 69, on which are mounted the shafts 68, also engages with the feed block 63 so that the feed block 63 may be securely held in position. When the cam 78-1 causes the feed lever 73 to rotate in the clockwise direction (indicated by the arrow r), the feed wedge 65 is advanced in the direction r while the feed block 63 is maintained stationary and enters between the rollers 61 so that the feed pawls 58 are moved toward each other in the direction indicated by the double-pointed arrow s (See FIG. 10(b)) and firmly grip and notch the pin blank 8. The depth of notches formed in the vertical faces of the pin blank 8 are dependent upon the position of the feed block and the stroke of the feed lever 73 as shown at j in FIG. 15.

When the feed lever 73 reaches a first predetermined limit of its advance stroke in the direction r, the stop lever 82 is caused to rotate is the clockwise direction so that the adjustable screw stopper 83 is moved away from the stopper block 81 and consequently the feed block 63 is released. When the feed layer 73 is further rotated in the direction r, both the feed block 63 and the feed wedge 65 are advanced in unison with each other over a distance t (See FIG. 17) until the feed block 63 engages with a stopper 152 while the pair of feed pawls 58 firmly grip the pin blank 8. The two-step movement of the feed block 63 in the manner described above may be easily accomplished by the suitable selection of the cam profiles of the cams 78.

Figure 12:
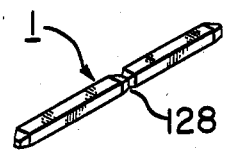
FIG. 12 is a perspective view of a pin formed with intermediate notches.
Figure 15:
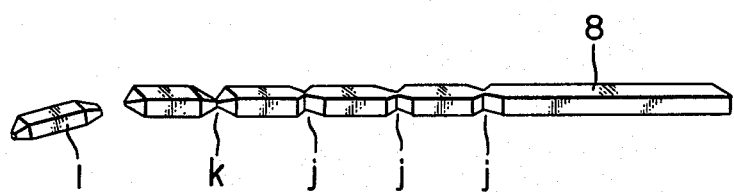
FIG. 15 shows a pin blank as it is transported through the pin insertion apparatus, notched and cut off.

As best shown in FIGS. 10(a), (c) and (d), the pin insertion head 20 is further provided with a pair of retaining pawls 88 so that the pin blank 8 may be also notched at the upper and bottom faces as shown in FIGS. 12 and 15 and may be securely retained in position while the pin 1 is inserted into an aperture of the board. The retaining pawls 88 are securely attached to one end of levers 89 which in turn are pivoted with a pivot pin 92 to a block 93. Rollers are rotatably mounted with pins 90 to the ends of the levers 89 opposite from the ends attached with the retaining pawls 88.

A compression spring 154 is loaded between the pair of levers 89 so that they may be normally moved away from each other.

A wedge 94 which is forced between the rollers 91 is slidably guided by a pair of wedge guide blocks 95 which in turn are securely attached to a head plate 96 which in turn is securely mounted on the head frame 56. The block 93 is formed with a groove or a pin blank passage 153 square in cross section so that the rotation of the pin blank 8 may be prevented. The retaining wedge 94 is normally biased upward under the force of a bias spring 93a and has a wedge-shaped lower end and a flat upper end 94a which is made into engagement with a roller 97. The roller 97 is carried at one end of a retaining lever 98 which in turn is pivoted with the pivot pin 76 to the head frame 56 for pivotal movement in the directions indicated by the double-pointed arrow u. A cam follower roller 99 is carried by the retaining lever 98 substantially at the midpoint between the ends thereof and is pressed against the cam 78-3. Therefore as the cam 78-3 rotates, the retaining lever 97 swings so that the retaining wedge 93 is caused to reciprocate vertically between the guide blocks 95.

The pin blank 8 is notched by the retaining pawls 88 at the upper and bottom surfaces so that its four side faces are notched as best shown in FIG. 12. Thereafter the pin blank 8 is fed through a square pin blank passage 100a extended through a stationary cutter 100 into a pin blank receiving groove 101a square in cross section and extended through a rotary cutter 100 (See FIG. 20(b)) which is rotatably mounted at the lower end of a guide rod 102 as best shown in FIG. 10(e). The stationary cutter 100 is detachably mounted on the head plate 96 so that a suitable cutter may be used as needs demand. The rotary cutter 101 is keyed to the lever 104 with a key 103 and may be replaced. A roller 106 is rotatably mounted with a shaft 105 which is securely attached to the lever 104 in offset relationship with the axis of the rotary cutter 101 and is operatively made into engagement with a grooved cam 108 formed with a cam groove 108a in parallel with the square groove 101a of the rotary cutter 101 and a cam groove 108b which is in parallel with a guide groove 107a formed in a guide 107 along its axis and one end of which is connected at a right angle to one end of the cam groove 108a (See FIG. 10(d)). The guide 107 is extended downward from the lower end of the guide member 102, and the grooved cam 108 is securely attached to the head plate 96.

The guide member 102 is coupled to a pin insertion member 111 through a clutch ball 109 fitted into a hole formed through the guide member 102 at the midpoint between the ends thereof. However, when the guide member 102 and the pin insertion member 111 are lowered by a predetermined stroke, the cltuch ball 109 is forced into a recess 112 formed in a head plate 113 so that the pin insertion member 111 is released from the guide member 102 and is further moved downward along the guide plate 113. An adjusting bolt 114 for adjusting the downward stroke of the guide member 102 is attached to the upper end of the guide plate 113 for engagement with laterally extended projection 102b at the upper end of the guide plate 102.

Figure 11:
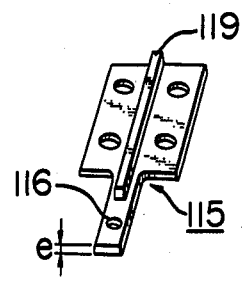
FIG. 11 is a perspective view of a pin ejector.

A pin ejector 115 which is attached to the lower end of the pin insertion member 111 normally close the square groove 101a of the rotary cutter 101 more than ⅓ of its length so that the pin 1 cut off from the pin blank 8 may be prevented from falling off the square groove 101a. The pin ejector 115 is best shown in FIG. 11. Received in a hole 116 close to the lower end of the pin ejector 115 a ball 117 the diameter of which is sufficiently greater than the thickness e of the pin ejector 115 and the width of the square groove 101a of the rotary cutter 101, and the ball 117 is normally biased toward the square groove 101a under the force of a pressure spring 118 fixed to the pin insertion member 111. Therefore the ball 117 may securely hold the pin 1 in the square groove 101a of the rotary cutter 101 even when the square groove 101a is vertically aligned with the guide groove 107a of the guide 107. The pin 1 is ejected only by the ridge-like projection 119 of the pin ejector and inserted into a predetermined hole or aperture in the board 7.

A projection 102a of the guide member 102 is into a notch 111a formed in the pin insertion member 111 and engages therewith when the pin blank 8 is cut off into a pin 1 or when the guide is lifted after the pin 1 has been inserted. The upper end of the pin insertion member 111 is pivoted with a pin 120 to the lower end of a link 121 the upper end of which is in turn pivoted with a pin 120a to one end of a head lever 122. The head lever 122 is pivoted with a pin 124 to a block or a bracket 123 securely fixed to the head frame 56, and has its the other end pivoted with a pin 126 to the upper end of a cylinder block 127 having its lower end pivoted to the pivot pin 87. Air is introduced into the cylinder block 127 in the direction indicated by the arrow g so that a cam follower roller 125 carried by the head lever 122 may be normally pressed against the cam 78-4.

Figures 10B, 10C:
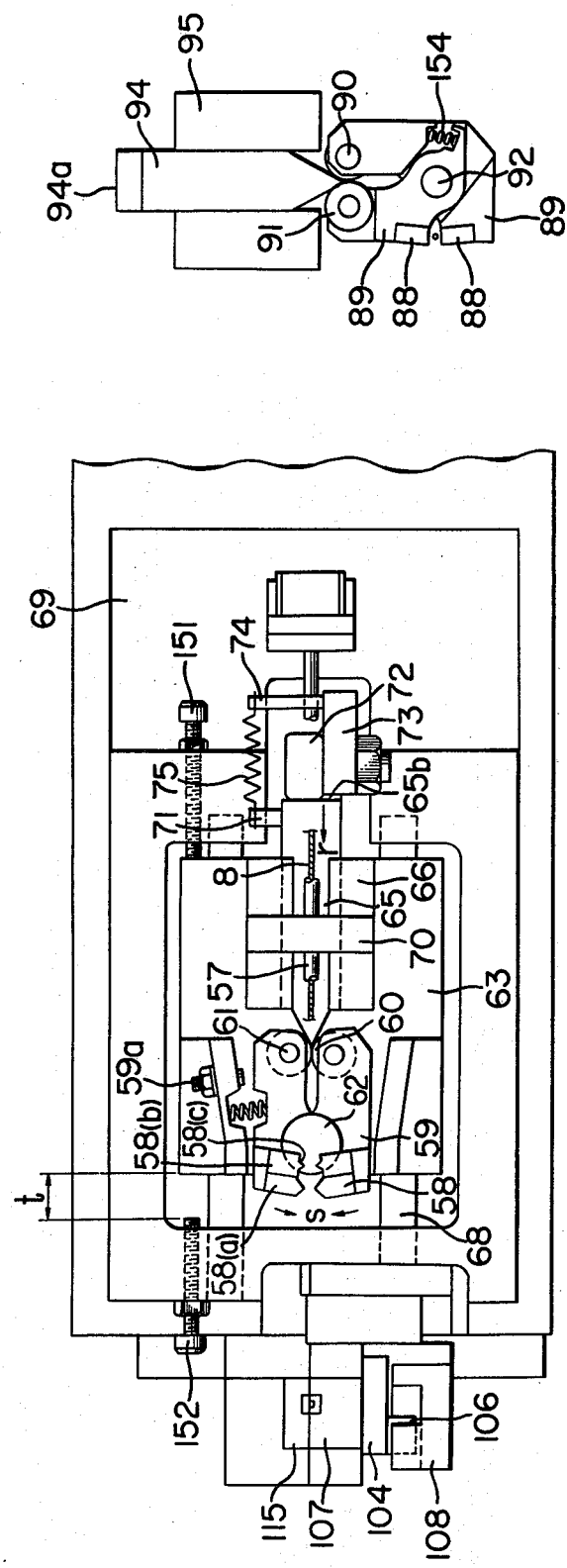
FIG. 10(b) is a bottom view thereof looking in the direction A in FIG. 10(a)
FIG. 10(c) is a view looking in the direction indicated by B in FIG. 10(a), a retaining block being removed.

As best shown in FIGS. 10(a) and 10(b), the feed pawls 58 are formed with two projections 58a and 58b while the retaining pawls 88, with two projections 88a and 88b. With the projections 58b and 88b, the pin 1 is formed with intermediate notches as shown in FIG. 12. The purpose of these intermediate notches is to prevent the rise of a flux when the board with inserted pins 1 is dipped into a bath of molten solder. However if such intermediate notches are not required, the projections 58b, 58c and 88b may be laminated. Furthermore the forms of the projections 58b and 88b may be so selected that a flange may be formed in the vicinity of the intermediate notches. This flange may serve to the correct positioning of the pin 1 when the latter is inserted into an aperture of the board.

Lower Die Unit 24

Figure 13:
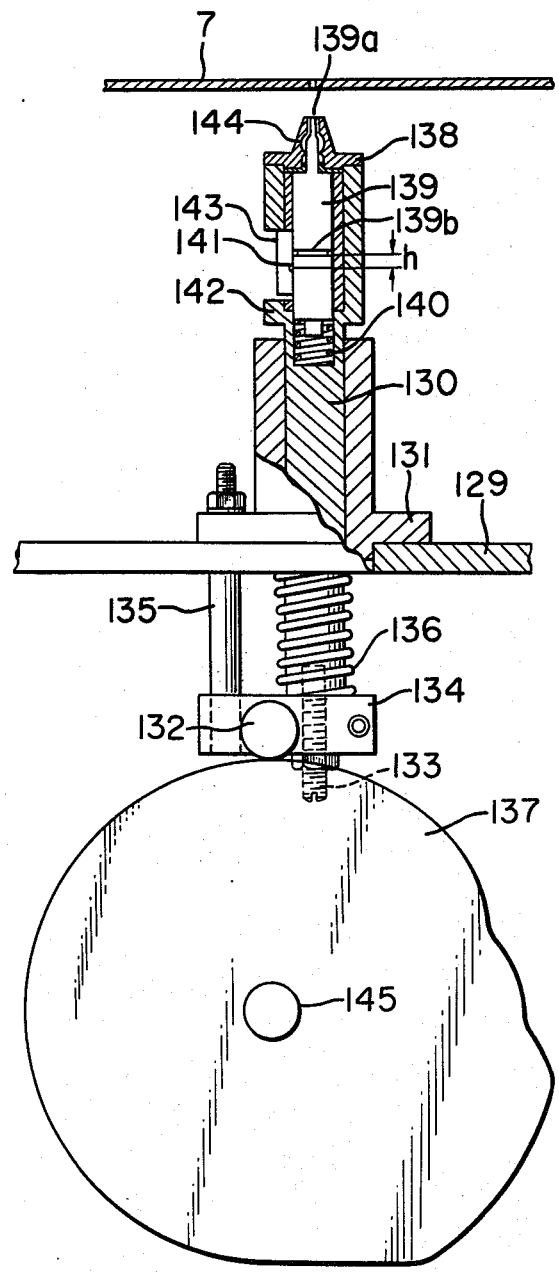
FIG. 13 is a front view, partly in section, of a lower die unit.
Figure 14:
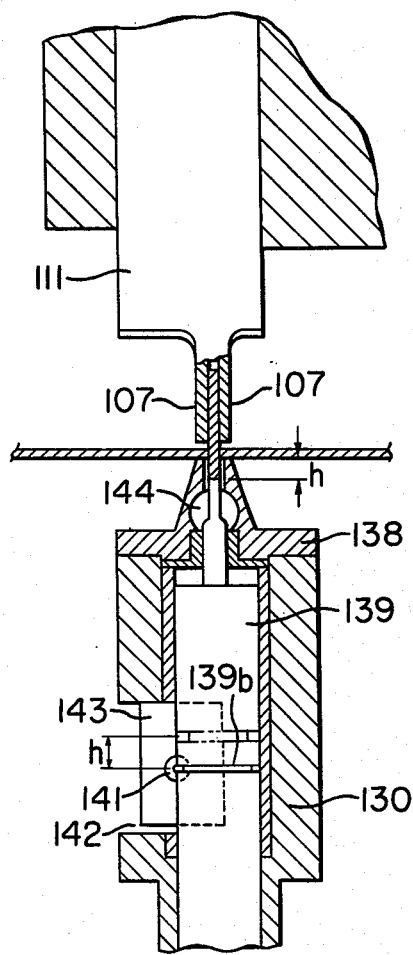
FIG. 14 is a fragmentary sectional view, on enlarged scale, thereof showing the positional relationship with a pin insertion guide 107 of the pin insertion head when a pin is inserted into an aperture in a board.

Next referring to FIG. 13 the lower die unit 24 will be described. An anvil 130 is slidably fitted into an anvil bush 131 securely mounted on a base 129 of the pin insertion apparatus, and has its lower end attached with a screw 133 to a block 134 attached to a support depending from the base 129. A coiled spring 136 is loaded between the base 129 and the block 134 so that a cam follower roller 132 may be normally pressed against the periphery of a cam 137 which is carried by a shaft 145.

A pin sensor 139 which is slidably fitted into a bore of the anvil 140 has an upright projection extended from the upper end of the anvil 130 and slidably fitted into a vertical, axial pin guide hole drilled or otherwise formed in a board receiving member or cap securely attached to the upper end of the anvil 130. A coiled spring 140 is loaded between the bottom of the bore and the lower end of the slidable sensor 139 in such a way that the upper end face 139a of the slidable sensor 139 may be normally held in coplanar relationship with the top surface of the board receiving member 138. A slidable detector 139 is formed with an annular groove 139b, and photoelectric detector means 143 consisting of a light source such as a light emitting diode and a photoelectric transducer is disposed in a cutout portion 142 of the anvil 130. A beam of light passes through a hole 141 from the light source to the photoelectric transducer, and is vertically spaced apart from the annular groove 139b of the slidable detector 139 by h when the top of the slidable detector 139 is in coplanar relationship with the top of the pin insertion guide cap 138. The distance h is equal to the length of the pin extended downward from the board 7 (See FIG. 14). The mode of operation of this photoelectric detector means 143 is apparent to those skilled in the art so that no further description shall be made.

The rotation of the cam 137 is correctly synchronized with the rotation of the cams 78 in such a way that the upper end of the cap 138 may be brought into engagement with the undersurface of the board 7 before the pin insertion guide 107 extended from the lower end of the pin insertion member 111 is made into engagement with the upper surface of the board 7. When the pin 1 is ejected out of the pin guide 107 by the pin ejector 115 and inserted into an aperture of the board 7, it pushes the slidable sensor 139 downward against the spring 140, whereby whether or not the pin 1 is extended downward beyond the board 7 by a predetermined length h.

Drive Unit 25

Referring to FIGS. 5 and 6, the drive unit 25 will be described. A motor 144 is securely mounted on a bracket 145 and is drivingly coupled with a chain 146 to a clutch-brake unit 147 which in turn drivingly coupled through a head drive shaft 148 and a chain 149 to the cam shaft 55 so that the cams 78 carried thereon may be rotated. The unit 147 is further drivingly coupled through the shaft 148 and a chain 150 to the cam shaft 145, whereby the cam 137 is rotated in synchronism with the cams 78.

Board Positioning Device 21

Referring to FIG. 4, the board positioning device 21 is mounted on a base 225 which in turn is securely mounted on the main body 40 of the pin insertion apparatus. A Y-table 227 is slidably mounted on Y-shafts 226, and the drive shaft of a pulse motor 228 mounted on the base 225 is connected to a Y-feed screw 229 threadably engaged with a nut 230 which in turn is securely attached to the Y-table 227. Therefore upon rotation of the pulse motor 228, the Y-table 227 slides in the Y-direction over the shaft 226.

In like manner, an X-table 232 is slidably mounted on X-shafts 231 which in turn are mounted on the Y-table 227. The drive shaft of a pulse motor 233 mounted on the Y-table 227 is connected to an X-feed screw 234 threadably engaged with a nut 235 securely fixed to the X-table 232. Therefore upon rotation of the X-pulse motor 233, the X-table 232 is moved in the X-directions at right angles to the Y-directions. Therefore an any selected aperture in the board 7 mounted on the board positioning device 21 may be moved and positioned immediately below the guide 107 of the pin insertion head 19 so that a plurality of pins may be inserted into predetermined apertures of the board 7.

Mode of Operation

Figure 16:
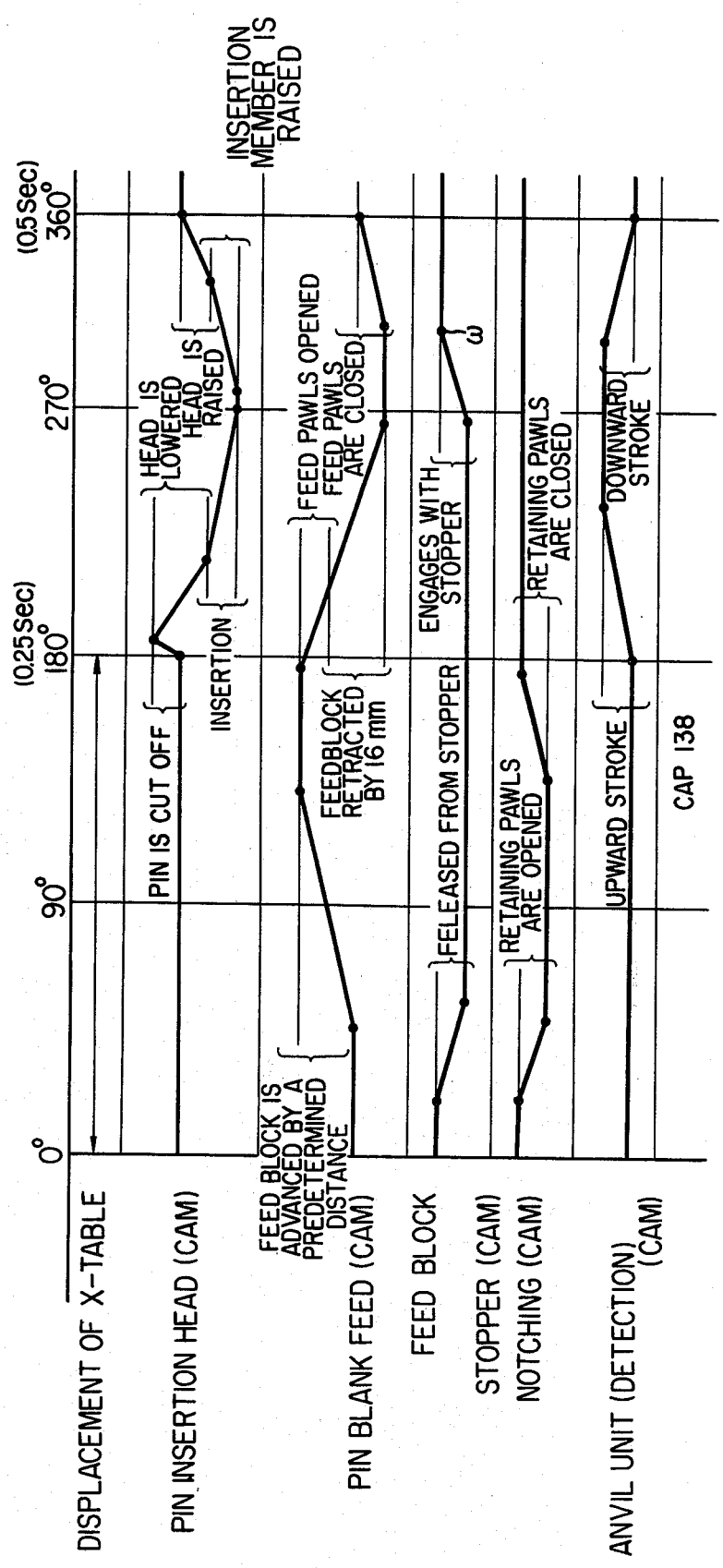
FIG. 16 is a timing diagram of the pin insertion apparatus.
Figure 17:
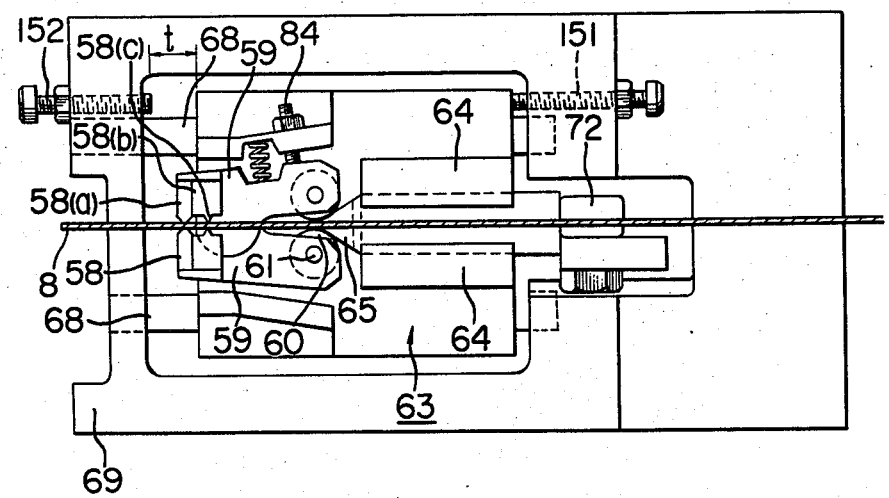
FIG. 17 is a bottom view of a feed block when the pin blank is gripped by a pair of feed pawls.
Figure 18:
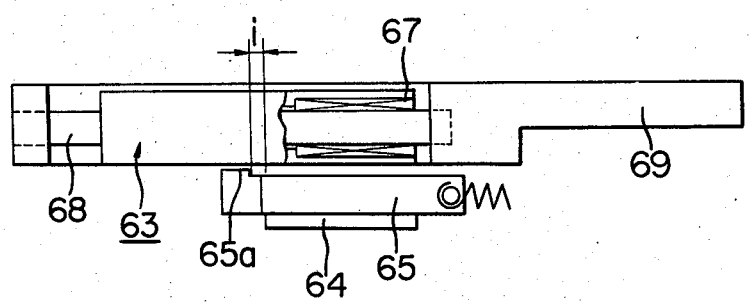
FIG. 18 is a side view thereof.

Referring particularly to the timing chart shown in FIG. 16 the mode of operation of the pin insertion apparatus having the major component units and devices described above will be explained. At the end w of the operation of the feed block stopper, the feed pawls 58 are held opened as shown in FIG. 10(b), and the feed block 63 is held in a predetermined position by the adjustable stopper 83 of the stop lever 82 and the return stroke stopper 151. At the point where the feed pawls 58 are closed, the feed pawls 58 grip the side faces of the pin blank 8 as shown in FIG. 17 and form notches as shown at j in FIG. 15. The notch positions are dependent upon the feed of the feed wedge 65 and the position at which the feed block 63 is stopped as described elsewhere. In this case, as shown in FIG. 18 the projection 65a of the feed wedge 65 is spaced apart from the edge of the slide plate 64 by i.

Figure 19:
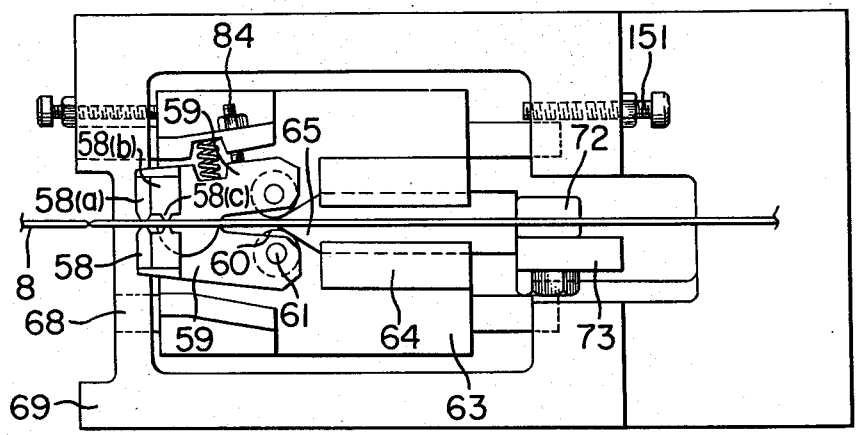
FIG. 19 is a bottom view of the feed block when the pin blank is advanced by a predetermined stroke from the position shown in FIG. 17.
Figure 20A:
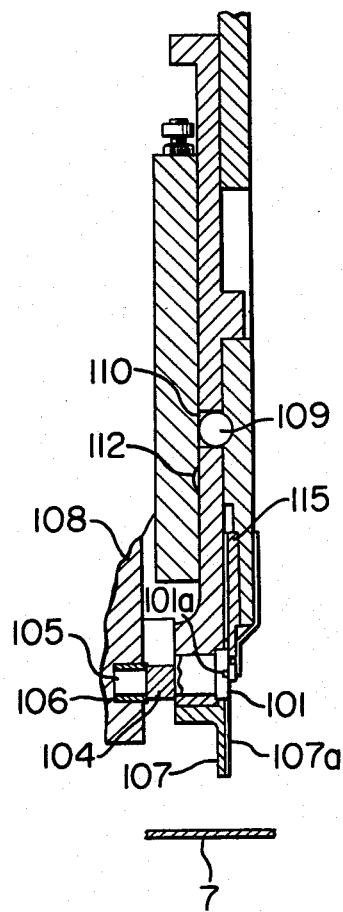
FIG. 20(a) is a vertical sectional view of the pin insertion head when the pin is cut off from the pin blank.
Figure 20B:
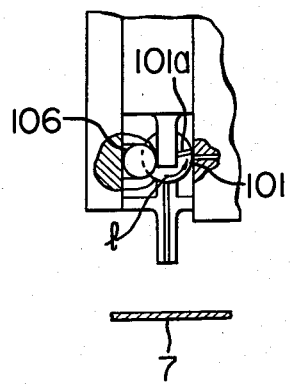
FIG. 20(b) is a fragmentary side view thereof.

When the feed cam passes past the point where "the feed pawl is closed", the notches are formed in the side faces of the pin blank 8 by the feed pawls 58 and the retaining pawls 88 are opened. The stopper lever 82 is caused to rotate in the clockwise direction so that the adjustable screw stopper 83 is moved away from the stopper block 81 of the feed block 63 (See FIG. 10). Thereafter the block 63 is advanced by a predetermined pitch of feed t as shown in FIG. 19, but the relative position of the feed wedge 65 to the feed pawls 58 remains unchanged. Next as indicated in FIG. 16, the operation of closing the retaining pawls is started so that the retaining pawls 88 form notches in the upper and bottom faces of the pin blank 8. Thus the pin blank 8 is formed with the notches as best shown at k in FIG. 15. When the pin insertion member 111 is lifted slightly with the pin blank 8 gripped by the retaining pawls 88 as shown in FIG. 20(a) the rotary cutter 101 is rotated in the direction indicated by the arrow l in FIG. 20(b) by the groove cam 108, whereby the pin 1 is cut off from the pin blank 8.

Figure 21A:
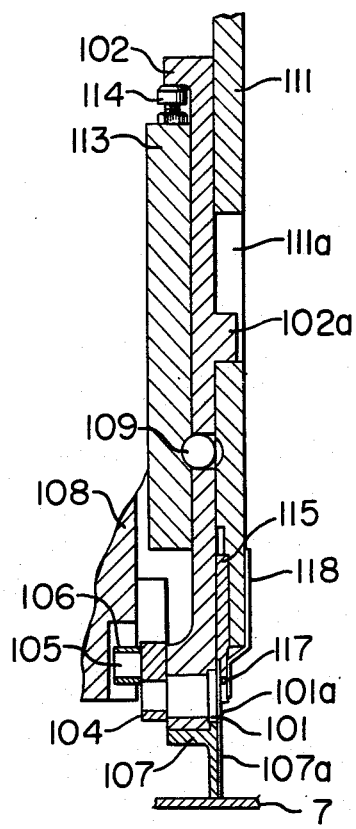
FIG. 21(a) is a longitudinal sectional view of the pin insertion head when the guide 107 is made into engagement with the upper surface of a board 7.
Figure 21B:
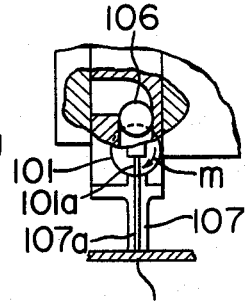
FIG. 21(b) is a fragmentary side view thereof.
Figure 21C:
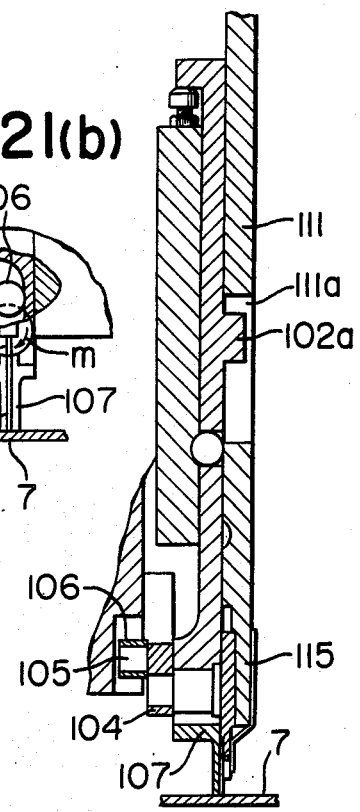
FIG. 21(c) is a longitudinal sectional view of the pin insertion head when a pin insertion member 111 is lowered from the position shown in FIG. 21(a)
Figure 22:
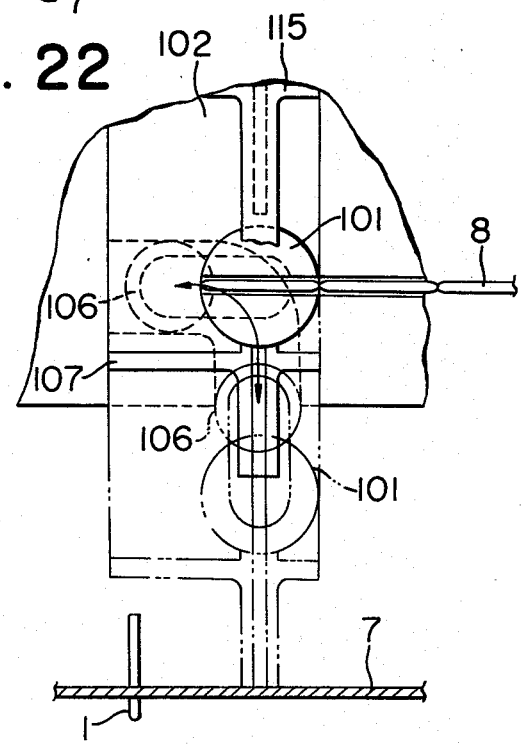
FIG. 22 is a fragmentary view, enlarged on scale, showing the lower end portion of the pin insertion head.

After the pin 1 having cut off, the pin insertion member 111 and the guide member 102 are simultaneously lowered as shown in FIG. 21(a) so that the rotary cutter 101 is rotated in the opposite direction as indicated by the arrow m in FIG. 21(b) until the square groove 101a and the guide groove 107a are aligned with each other. When the lower end of the guide 107 is made into engagement with the upper surface of the board 7, the clutch ball 109 of the guide member 102 is forced into the recess 112 in the guide plate 113 so that the pin insertion member 111 is released from the guide member 102 and only the member 111 is lowered further, whereby the pin 1 is ejected by the pin ejector 115 and inserted into a predetermined aperture of the board 7 as shown in FIG. 21(c). As the pin insertion step is started, the feed lever 73 is caused to rotate in the counterclockwise direction (See FIG. 10) so that the feed wedge 65 is retracted away from the rollers 61 and consequently the feed pawls 58 are opened or moved away form each other. When the wedge 65 is retracted by the stroke i (See FIG. 18), the projection 65a of the feed wedge 65 engages with the slide plate 64 so that the feed block 63 is also retracted under the force of the return spring 75. When the feed block 63 has been returned to its initial position, the stop lever 82 is caused to rotate in the counterclockwise direction so that the adjustable screw stopper 83 engages again with the stopper block 81 of the feed block 63, whereby the block 63 may be maintained in the initial position. Thus one cycle of pin insertion is completed.

As described above, according to the present invention, the dies may be eliminated; the maintenance may be much facilitated; and the cost of the pins may be reduced by 50% as compared with the prior art methods, whereby the cost for insertion of pins into boards may be considerably reduced. Furthermore the damages to the pin blank may be avoided when the blank is fed, and the variation in length of the pins 1 cut off from the blank 8 may be minimized so that the pin blank may be fed at a relatively high speed. Moreover the pin blank is formed with notches by the feed and retaining pawls so that the pins may be cut off from the pin blank with a minimum shearing force. As a result, shearing impact may be minimized so that the pin blank shearing mechanism may be simplified to a considerable degree and the noise may be suppressed. Moreover the pin is rotated about its center or the midpoint between its ends so that the inertia of the pin is less. As a result the pin insertion may be effected in a very reliable and dependable manner even when the rotary cutter is rotated at a high speed.

Since cam mechanisms are employed in order to ensure the high-speed operation, there may be provided a pin insertion apparatus which produces less noise, is very simple in construction and operates at a high speed.

Furthermore the blank is made to pass through the feed and guide passages having a cross sectional configuration substantially similar to that of the pin blank so that the faces of the inserted pins may be oriented in the same directions. Therefore instead of the conventional flanged, round pins the square pins may be used as connection terminals.

Since the intermediate notches may be formed in the faces of the pin intermediate its ends in a simple manner, the rise of a flux along the pins may be avoided when a board with the inserted pins is dipped into a bath of molten solder.

We claim:
1. A pin insertion apparatus comprising
   a stock station for storing a pin blank in the form of a wire, pin blank feed means for intermittently extracting said pin blank from said pin blank stock station and feeding at a predetermined feed or pitch,
   notching means operating in synchronism with said feed means for notching or forming notch-like recesses in said pin blank, cutting or shearing means for receiving the leading end of said pin blank, moving so as to cut or shear a pin from said pin blank at the notched portion thereof and orienting said pin in the pin insertion direction,
   pin insertion means for pushing said pin toward a board or the like, thereby inserting said pin into a predetermined aperture in said board or the like, and
   board positioning means for supporting said board or the like.

2. A pin insertion apparatus as set forth in claim 1 wherein said pin blank stock station includes a reel having flanges spaced apart axially of said reel from each other and winding thereon said pin blank in the form of a hoop, and a flexible ribbon- or belt-shaped member which is partly made in contact with said flanges of said reel and which is normally imparted with tension.

3. A pin insertion apparatus as set forth in claim 1 wherein
   said stock station includes a reel holding said pin blank in the form of a hoop, and straightening means is disposed between said reel and said pin blank feed means for straightening said pin blank.

4. A pin insertion apparatus as set forth in claim 3 wherein
disposed between said pin blank stock station and said straightening means is a tension imparting means consisting of a rotary disk having a circular groove formed in the periphery thereof, a pressure roller for pressing said pin blank against said rotary disk when said pin blank passes through said circular groove of said rotary disk, and a friction means for generating the frictional force which exerts on said rotary disk against the direction of rotation of said rotary disk.

5. A pin insertion apparatus as set forth in claim 1 wherein
said cutting means includes a rotary body having a groove for receiving the leading end portion of said pin blank,
said rotary body is rotated so that a pin is cut off from said pin blank at the notched portion, and
said rotary body is further rotated so that the axis of said cut off pin may be in line with said pin insertion direction perpendicular to said board or the like.

6. A pin insertion apparatus as set forth in claim 5 wherein
the diameter of said rotary body is equal to or slightly shorter than the length of a pin to be cut off from said pin blank, and
said groove has a length sufficient for receiving a pin.

7. A pin insertion apparatus as set forth in claim 1 further including notching means for forming notch-like recesses in the faces of said pin blank intermediate its notches formed by said first mentioned notching means, said intermediate notches serving to prevent the rise of a flap produced in case of soldering.

8. A pin insertion apparatus as set forth in claim 7 wherein
said first and second mentioned notching means are combined into a unit.

9. A pin insertion apparatus comprising
pin blank stock station for storing a pin blank in the form of a wire, a pair of feed pawls for gripping and notching said pin blank extended from said pin blank stock station and feeding said pin blank by a predetermined feed or pitch, thereby forming notch-like recesses in said pin blank at a predetermined pitch and feed said pin blank at a predetermined feed or pitch,
cutting means for receiving the leading end of said pin blank fed from said pair of feed pawls, moving so as to cut a pin off from said pin blank at the notched portion and orienting said pin in the pin insertion direction,
pin insertion means for pushing said pin toward a board or the like and inserting said pin into a predetermined aperture in said board or the like, and
board positioning means for supporting said board or the like.

10. A pin insertion apparatus as set forth in claim 9 wherein
said pin blank stock station includes a real holding said pin blank in the form of a hoop, and straightening means is disposed between said real and said pair of feed pawls for straightening said pin blank.

11. A pin insertion apparatus as set forth in claim 10 wherein
disposed between said pin blank stock station and said pin blank straightening means is a tension imparting means consisting of a rotary disk having a circular groove formed in the periphery thereof, a pressure roller for pressing said pin blank against said rotary disk when said pin blank passes through said circular groove of said rotary disk, and a friction means for generating the frictional force which exerts on said rotary disk against the direction of rotation of said rotary disk.

12. A pin insertion apparatus as set forth in claim 9 further comprising a pair of retaining pawls for gripping and notching said pin blank in such a way that notch-like recesses may be formed in the faces of said pin blank adjacent to the faces where the notch-like recesses are formed by said pair of feed pawls and that the notch-like recesses formed in the four faces of said pin blank are contiguous and at right angles relative to each other.

13. A pin insertion apparatus as set forth in claim 9 wherein
said cutting means includes a rotary body having a groove for receiving the leading end portion of said pin blank,
said rotary body is rotated so that a pin is cut off from said pin blank at the notched portion, and
said rotary body is further rotated so that the axis of said cut off pin may be in line with said pin insertion direction perpendicular to said board or the like.

14. A pin insertion apparatus as set forth in claim 13 wherein
the diameter of said rotary body is equal to or slightly shorter than the length of a pin cut off from said pin blank, and
said groove has a length sufficient for receiving therein a pin.

15. A pin insertion apparatus as set forth in claim 9 wherein
said pin blank stock station includes a reel having flanges spaced apart from each other axially of said reel and winding said pin blank in the form of a hoop, and
a flexible ribbon- or belt-shaped member which is partly made into contact with said flanges and which is normally imparted with tension.

16. A pin insertion apparatus as set forth in claim 9 wherein
said cutting means includes a rotary body having a groove for receiving the leading end portion of said pin blank corresponding in length to a pin to be cut off therefrom,
said rotary body is rotated so that a pin is cut off from said pin blank form the notched portion, and
said rotary body is further rotated so that the axis of said pin in said groove may be in line with said pin insertion direction perpendicular to said board or the like; and said pin insertion apparatus is further provided with means elastically extended into the lower end portion of said groove of said rotary body when said groove is made in line with said insertion direction.

a side plate upon which is attached said elastically extended means and which close the opening of said groove, and pin insertion projections which is moved downward when said side plate is moved downward, thereby pushing the pin downward.

17. A pin insertion apparatus as set forth in claim 9 further including notching means for forming notch-like recesses in the faces of said pin blank intermediate its notches formed by said first mentioned notching means, said intermediate notches serving to prevent the rise of flap produced in case of soldering.

18. A pin insertion apparatus as set forth in claim 9 wherein
said notching means is formed integral with said pair of feed pawls.

19. A pin insertion apparatus as set forth in claim 9 wherein
said board positioning means is movable in a plane in parallel with said board or the like.

20. A pin insertion apparatus comprising
a pin blank stock station for storing a pin blank in the form of a wire, a pair of feed pawls for gripping and notching said pin blank fed from said pin blank stock station and displacing said pin blank by a predetermined feed or pitch, whereby notches are formed in the faces of said pin blank at a predetermined pitch,
cutting means which receiving the leading portion of said pin blank and is moved so as to cut off a pin from said pin blank and orients said cut off pin in the pin insertion direction.
pin insertion means for inserting said pin into a predetermined aperture of a board or the like, board positioning means for supporting said board or the like, and anvil means disposed below said board or the like for detecting the insertion of said pin into said predetermined aperture of said board or the like.

21. A pin insertion apparatus as set forth in claim 20 wherein
said anvil means includes a slidable detector which is displaced by the leading end of said pin extending the undersurface of said board or the like, and
sensor means for sensing the displacement of said slidable detector.

22. A pin insertion apparatus as set forth in claim 20 wherein
said anvil means includes board supporting means for supporting said board or the like from the below in such a way that a pin guide hole of said supporting means may be in line with said predetermined aperture in said board or the like, said supporting means being formed with a sapce which is in communication with the pin insertion position and which is in parallel with said board or the like.

23. A pin insertion method comprising the steps of intermittently feeding a pin blank in the form of a wire, notching the faces of said pin blank at a predetermined pitch, cutting off a pin from said pin blank at the notched portion, holding said pin in a predetermined direction, and
pushing said pin and inserting it into a predetermined aperture in a board or the like.

24. A pin insertion method as set forth in claim 23 wherein
the notches are formed by a pair of pawls which grip said pin blank and intermittently feed said pin blank.

25. A pin insertion apparatus comprising
a reel around which is wound a pin blank in the form of a wire,
a pair of feed pawls which notch the faces of said pin blank at a predetermined pitch and which grip said pin blank to feed at a predetermined pitch,
a pair of cutters for notching the faces of said pin blank intermediate notches formed by said pair of feed pawls, said intermediate notches being shallower than said first formed notches and serving to prevent the rise of flap in case of soldering.
a rotary disk which is disposed upstream of said pair of feed pawls and which has a circular groove formed in the periphery for passing said pin blank,
a pressure roller for pressing said pin blank into said circular groove,
a friction plate for applying brake to said rotary disk,
a notching means disposed downstream of said pair of feed pawls for gripping and notching the faces of said pin blank which have not been notched by said pair of feed pawls in such a manner that new notches are formed in the faces of said pin blank in contiguous with said first formed notches and at right angles thereto and that new intermediate notches are formed in the faces of said pin blank in contiguous with said first formed intermediate notches and at right angles thereto,
a rotary cutter having a groove for receiving the leading portion of said pin blank corresponding in length to a pin to be cut off therefrom.
said rotary cutter being rotated so that a pin is cut off from said pin blank at the notched portion and the cut off pin is directed toward the pin insertion direction,
a pin insertion means for pushing said pin out of said groove of said rotary cutter so as to insert it into a predetermined aperture in a board or the like,
a board positioning means for supporting said board or the like and moving in every direction said board or the like in a plane in parallel with said board or the like, and
anvil means disposed below said board or the like supported by said board positioning means and adapted for detecting the pin inserted into said predetermined aperture and extended downward from said board or the like.

* * * * *

UNITED STATES PATENT AND TRADEMARK OFFICE
CERTIFICATE OF CORRECTION

PATENT NO. : 4,166,316
DATED : September 4, 1979
INVENTOR(S) : Yoshihiko Misawa, et al It is certified that error appears in the above—identified patent and that said Letters Patent is hereby corrected as shown below:

Column 1, line 40: "females" should be --female--.

line 47: After "must not" insert --be--.

Column 2, line 14: "therfrom" should be --therefrom--.

Column 3, line 65: In the caption, "PREVERRED" should be --PREFERRED--.

Column 4, line 66: Change numeral "9" to --8--.

Column 7, line 46: Change "is" (second occurrence) to -- in --.

line 49: Change "layer" to --lever--.

Column 10, line 58: After "Therefore" cancel "an".

Column 11, line 53: Change "form" to --from--.

line 22: Change "of" to --or--.

UNITED STATES PATENT OFFICE
CERTIFICATE OF CORRECTION

PATENT NO. : 4,166,316

DATED : September 4, 1979

INVENTOR(S) : Yoshihiko Misawa, et al

It is certified that error appears in the above-identified patent and that said Letters Patent are hereby corrected as shown below:

Column 14, line 68: Change the period to a comma.

Column 15, line 53: "sapce" should be --space--.

Signed and Sealed this

Tenth Day of June 1980

[SEAL]

Attest:

Attesting Officer

SIDNEY A. DIAMOND

Commissioner of Patents and Trademarks